(12) United States Patent
Rao et al.

(10) Patent No.: US 7,563,662 B2
(45) Date of Patent: Jul. 21, 2009

(54) PROCESSES FOR FORMING ELECTRONIC DEVICES INCLUDING NON-VOLATILE MEMORY

(75) Inventors: Rajesh A. Rao, Austin, TX (US); Ramachandran Muralidhar, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 490 days.

(21) Appl. No.: 11/084,283

(22) Filed: Mar. 18, 2005

(65) Prior Publication Data

US 2006/0211206 A1 Sep. 21, 2006

(51) Int. Cl.
*H01L 21/336* (2006.01)
(52) U.S. Cl. ............... 438/197; 438/201; 438/257; 438/258; 438/266; 257/E27.018; 257/E27.064; 257/E21.598
(58) Field of Classification Search .............. 438/197, 438/201, 257, 258, 266
See application file for complete search history.

(56) References Cited

U.S. PATENT DOCUMENTS

| 6,146,970 | A | 11/2000 | Witek et al. |
| 6,534,363 | B2 * | 3/2003 | Kim ........................ 438/258 |
| 7,361,543 | B2 * | 4/2008 | Steimle et al. ............ 438/201 |

OTHER PUBLICATIONS

U.S. Appl. No. 10/876,820, filed Jun. 25, 2004.

* cited by examiner

*Primary Examiner*—Hsien-ming Lee

(57) ABSTRACT

A process for forming an electronic device can be performed, such that as little as one gate electric layer may be formed within each region of the electronic device. In one embodiment, the electronic device can include an NVM array and other regions that have different gate dielectric layers. By protecting the field isolation regions within the NVM array and other regions while gate dielectric layer are formed, the field isolation regions may be exposed to as little as one oxide etch between the time any of the gate dielectric layers are formed the time such gate dielectric layers are covered by gate electrode layers. The process helps to reduce field isolation erosion and reduce problems associated therewith.

20 Claims, 5 Drawing Sheets

PROCESSES FOR FORMING ELECTRONIC DEVICES INCLUDING NON-VOLATILE MEMORY

BACKGROUND

1. Field of the Disclosure

The present disclosure relates to electronic devices and processes for forming them, and more particularly to electronic devices including field isolation regions and non-volatile memory and processes for forming the same.

2. Description of the Related Art

Integration of non-volatile memory ("NVM") arrays into electronic devices, such as integrated circuits, is becoming more difficult as the number of gate dielectric layers present within the electronic device continues to increase. Currently, three or more different gate dielectric layers may be formed. A conventional process sequence includes formation and etching the gate dielectric layers until the last gate dielectric layer has been formed. During this processing sequence, the field isolation regions between active regions are etched multiple times. The field isolation regions are thinned, and corners of the substrate at the field isolation regions become exposed along sides that formerly contacted the field isolation regions. When forming gate electrodes, not all of the gate electrode layer may be removed during patterning, thus resulting in stringers that can form electrical shorts or leakage paths between different transistors that are not to be electrically connected to each other. The corner also creates a point of relatively higher electrical field. Also, the last gate dielectric is typically thinner near the corner than at locations further from the corner. When a subsequently-formed gate electrode is biased, the gate dielectric layer at the corner of the substrate adjacent to the field isolation region may fail at a voltage lower than the designed operating voltage for the transistor.

BRIEF DESCRIPTION OF THE DRAWINGS

Embodiments are illustrated by way of example and not limitation in the accompanying figures.

Figure 1:
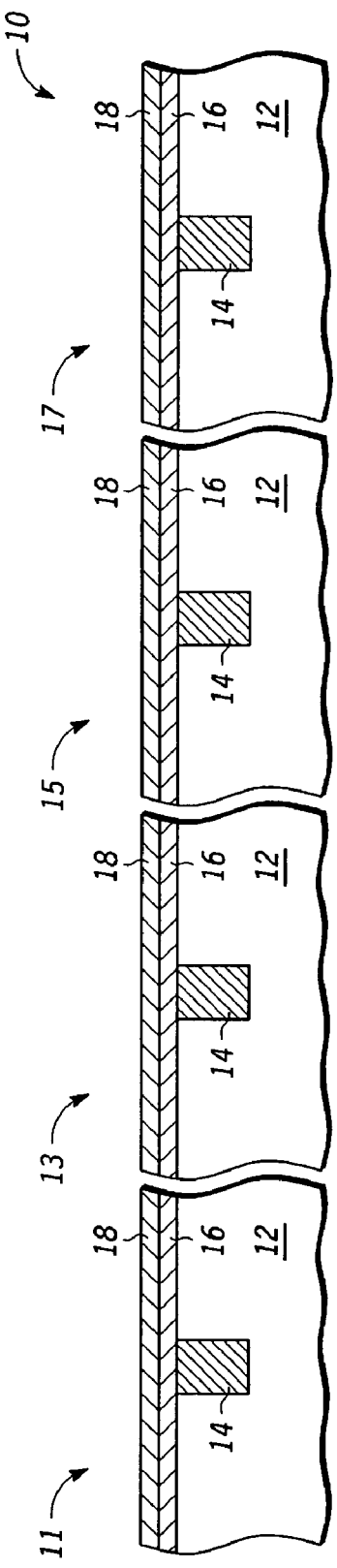
FIG. 1 includes an illustration of a cross-sectional view of regions of a substrate after forming a protective layer over different regions of the substrate.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments.

DETAILED DESCRIPTION

A process for forming an electronic device can be performed, such that as little as one gate dielectric layer may be formed within each region of the electronic device. In one embodiment, the electronic device can include an NVM array and other regions that have different gate dielectric layers. By protecting the field isolation regions within the NVM array and other regions while gate dielectric layer are formed, the field isolation regions may be exposed to as little as one oxide etch between the time any of the gate dielectric layers are formed and the time such gate dielectric layers are covered by gate electrode layers. The process helps to reduce field isolation erosion and reduce problems associated therewith.

In a first aspect, a process for forming an electronic device can include forming a field isolation region over a substrate, wherein an active region lies outside the field isolation region. The process can also include forming a sacrificial layer over the active region and forming a plurality of gate dielectric layers. Each gate dielectric layer within the plurality of gate dielectric layers has a targeted thickness different from the one or more other gate dielectric layers. When forming each gate dielectric layer, the process can include removing a portion of the sacrificial layer to form an exposed portion of the active region, and forming the each gate dielectric layer over the exposed portion of the active region. A portion of the field isolation region immediately adjacent to the exposed portion of the active region is exposed to a single oxide etch between forming the sacrificial layer and forming the each gate dielectric layer.

In one embodiment of the first aspect, removing the portion of the sacrificial layer includes exposing a portion of the field isolation region. In another embodiment, forming the field isolation region includes forming a trench field isolation region. In still another embodiment, forming the plurality of gate dielectric layers includes forming at least three different gate dielectric layers, each having a different targeted thickness.

In a further embodiment of the first aspect, the electronic device includes a non-volatile memory device. In a particular embodiment, forming the plurality of gate dielectric layers includes removing a first portion of the sacrificial insulating layer and forming a first gate dielectric layer over a non-volatile memory portion of the active region. Forming the plurality of gate dielectric layers includes removing a second portion of the sacrificial layer and forming a second gate dielectric layer over a second portion of the active region, wherein the second gate dielectric layer has a different targeted thickness compared to the first gate dielectric layer. Forming the plurality of gate dielectric layers still further includes removing a third portion of the sacrificial insulating layer and forming a third gate dielectric layer over a logic portion of the active region, wherein the third gate dielectric layer has a different targeted thickness compared to the first gate dielectric layer and the second gate dielectric layer.

In a more particular embodiment of the first aspect, the third gate dielectric layer is part of logic components being formed within the electronic device, and the logic gate dielectric layer is the last of the plurality of the gate dielectric layers to be formed. In another more particular embodiment, the process further includes forming a resist mask over a first part of a logic region of the active region, implanting a dopant for a well region within the logic region, and removing the resist mask, wherein implanting the dopant is performed before forming the third gate dielectric layer over the well region. In an even more particular embodiment, forming the second gate dielectric layer includes forming at least a portion of the second gate dielectric layer using steam, wherein forming the third gate dielectric layer is performed after forming the first gate dielectric layer and forming the second gate dielectric layer.

In yet a further embodiment of the first aspect, forming the plurality of gate dielectric layers can include forming a first gate dielectric layer lying within non-volatile memory cells, forming a second gate dielectric layer lying within I/O components, forming a third gate dielectric layer lying within logic components, and forming a fourth gate dielectric layer lying within HV components.

In a second aspect, a process for forming a non-volatile memory device can include forming a trench field isolation region over a substrate to define an active region in the substrate, wherein the active region includes a first portion, a non-volatile memory portion, and a logic portion. The process can also include forming a sacrificial insulating layer over the first portion of the active region, the non-volatile memory portion of the active region, and the logic portion of the active region. The process can further include removing a non-volatile memory portion of the sacrificial insulating layer, wherein a non-volatile memory portion of the trench field isolation region is exposed after the non-volatile memory portion of the sacrificial layer is removed, and forming a first gate dielectric layer over the non-volatile memory portion of the active region. The process can still further include removing a first portion of the sacrificial insulating layer, wherein a first portion of the trench field isolation region is exposed after the first portion of the sacrificial layer is removed, and forming a second gate dielectric layer over the first portion of the active region. The process can yet further include removing a logic portion of the sacrificial insulating layer, wherein a logic portion of the trench field isolation region is exposed after the logic portion of the sacrificial layer is removed, and forming a third gate dielectric layer over the logic portion of the active region.

In one embodiment of the second aspect, the process can further include removing a second portion of the sacrificial insulating layer, wherein a second portion of the trench field isolation region is exposed after the second portion of the sacrificial layer is removed, and forming a fourth gate dielectric layer over the second portion of the active region. The fourth gate dielectric layer is part of I/O components within the non-volatile memory device, and the second gate dielectric layer is part of HV components within the non-volatile memory device.

In another embodiment of the second aspect, removing the non-volatile memory portion of the sacrificial insulating layer does not remove the sacrificial insulating layer, if any, overlying the first portion of the active region or logic portion of the active region. Removing the first portion of the sacrificial insulating layer does not remove the sacrificial insulating layer, if any, overlying the non-volatile memory portion of the active region or logic portion of the active region. Removing the logic portion of the sacrificial insulating layer does not remove the sacrificial insulating layer, if any, overlying the non-volatile portion of the active region or first portion of the active region.

In still another embodiment of the second aspect, forming the third gate dielectric layer is performed after forming the first gate dielectric layer and forming the second gate dielectric layer. In a particular embodiment, forming the first gate dielectric layer is performed before forming the second gate dielectric layer. In a more particular embodiment, the process can further includes forming a charge storage layer over the substrate, forming a control gate conductor layer over the charge storage layer, and removing portions of the charge storage layer and control gate conductor layer that overlie the first portion of the active region and the logic portion of the active region. In an even more particular embodiment, the process further includes forming a first gate conductor layer over the substrate including first portion of the active region.

In another even more particular embodiment of the second aspect, the process can further includes forming a first resist mask over a first part of a logic region of the active region to define a first opening, removing first portions of the control gate layer and charge storage layer underlying the first opening in the first resist mask, implanting a first dopant for a first well region within the logic region, wherein the first well region underlies the first opening, and removing the first resist mask. Implanting the first dopant is performed before forming the third gate dielectric layer over the well region, and removing the logic portion of the sacrificial insulating layer includes removing a first part of the sacrificial layer that overlies the first part of the logic region. In still an even more specific embodiment, the process can further include forming a second resist mask over a second part of a logic region of the active region to define a second opening, removing second portions of the control gate layer and charge storage layer underlying the second opening in the first resist mask, implanting a second dopant for a second well region within the logic region, wherein the second well region underlies the second opening, and the second dopant has a conductivity type opposite the first dopant, and removing the second resist mask. Implanting the second dopant is performed before forming the third gate dielectric layer over the well region. Removing the logic portion of the sacrificial insulating layer further includes removing a second part of the sacrificial layer that overlies the second part of the logic region.

In still an even more particular embodiment of the second aspect forming the second gate dielectric layer includes forming at least a portion of the second gate dielectric layer is formed using steam.

Before addressing details of embodiments described below, some terms are defined or clarified. Group numbers corresponding to columns within the Periodic Table of the elements use the "New Notation" convention as seen in the *CRC Handbook of Chemistry and Physics*, 81$^{st}$ Edition (2000).

The term "stack" is intended to mean a plurality of layers or a plurality of at least one layer and at least one structure (e.g., nanocrystals), wherein the plurality of layers or plurality of layer(s) and structure(s) provides an electronic function. For example, a non-volatile memory stack can include layers used to form at least part of a non-volatile memory cell. A stack may be part of a larger stack. For example, a non-volatile memory stack can include a charge storage stack that is used to store charge within a non-volatile memory cell.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the terms "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the semiconductor and microelectronic arts.

FIG. 1 includes an illustration of different regions of a substrate 12 within an electronic device 10 (e.g., an integrated circuit) after forming a mask layer over some of the regions of the substrate 12. The substrate 12 can include a monocrystalline semiconductor wafer, a semiconductor-on-insulator wafer, a flat panel display (e.g., a silicon layer over a glass plate), or other substrate that is conventionally used to form electronic devices. High-voltage ("HV") components will be formed within an HV region 11, input/output ("I/O") components will be formed within an I/O region 13, NVM memory cells will be formed within the NVM array 15, and logic components will be formed within a logic region 17.

Field isolation regions 14 are formed within the substrate 12, as illustrated in FIG. 1, using a conventional technique. In one embodiment, the field isolation regions 14 are trench field isolation regions that are formed by etching trenches into the substrate 12, filling the trenches with an insulating layer (e.g., an oxide), and using chemical-mechanical polishing to remove portions of the insulating layer outside of the trenches. In another embodiment, another technique may be used, such as a conventional local oxidation of silicon ("LOCOS") process.

A protective layer is formed over the substrate 12. In one embodiment, the protective layer includes an oxide layer 16 and a nitride layer or a polysilicon layer 18, which can be formed by a conventional thermal growth or deposition technique. The protective layer helps to protect the field isolation regions 14 from erosion when processing is more focused on other regions of the substrate 12.

Figure 2:
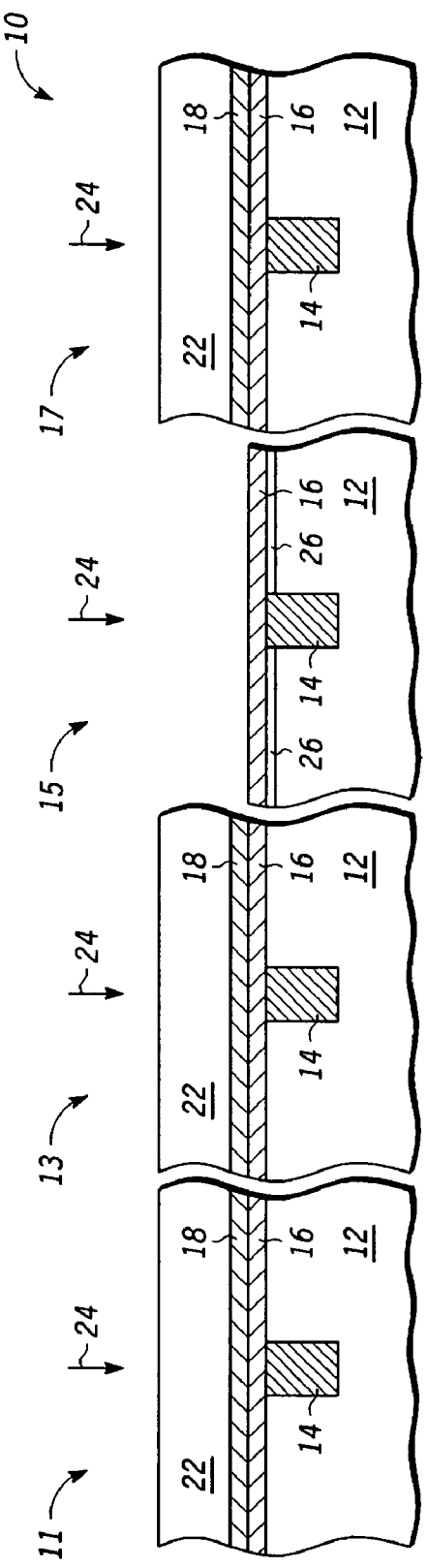
FIG. 2 includes an illustration of a cross-sectional view of the regions of FIG. 1 after doping a portion of the substrate that will become a well region within an NVM array.

At this point in the process, processing for the NVM cell within the NVM array 15 is performed. A mask 22 is formed over the HV, I/O, and logic regions 11, 13, and 17, as illustrated in FIG. 2. The NVM array 15 is exposed (not covered by the mask 22). The mask 22 can include a conventional resist material. The conventional resist material may be patterned using a conventional lithographic technique. One or both of the nitride layer 18 and the oxide layer 16 can be removed from over the NVM array 15. In one embodiment, the nitride layer 18 is removed, and the oxide layer 16 remains. A dopant is introduced into the NVM array 15 of the substrate 12 to form doped regions 26 that will be subsequently driven into the substrate 12 to form well regions. The dopant may be a p-type dopant (e.g., boron) or an n-type dopant (e.g., phosphorus or arsenic). In one embodiment, the dopant can be introduced using ion implantation (illustrated as arrows 24 in FIG. 2). The mask 22 prevents a significant amount of the dopant from entering the substrate 12 within the HV, I/O, and logic regions 11, 13, and 17. After the doped regions 26 are formed, the mask 22 is removed using a conventional technique. If exposed portions of the oxide layer 16 have not yet been removed, they can be removed at this time.

Figure 3:
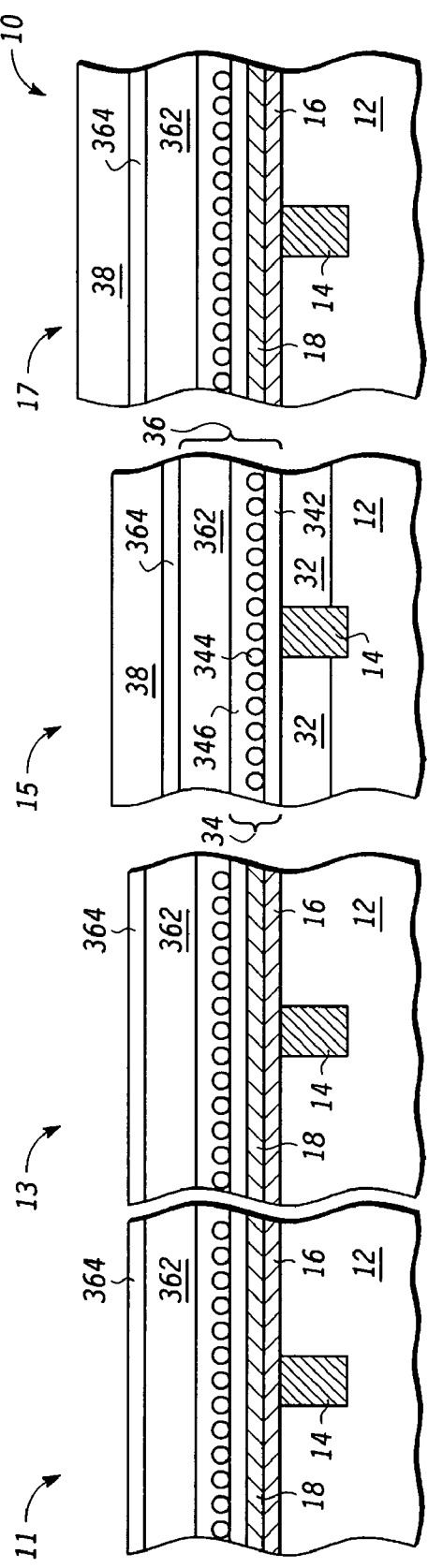
FIG. 3 includes an illustration of a cross-sectional view of the regions of FIG. 2 after forming an NVM stack and a mask layer.

An optional well drive cycle is performed to drive the dopant from the doped regions 26 further into the substrate 12 to form the well regions 32 within the NVM array 15, as illustrated in FIG. 3. An NVM stack 36 is formed over the substrate 12. The NVM stack 36 includes a charge storage stack 34 and a control gate electrode layer 362. The charge storage stack 34 includes a first gate dielectric layer 342, a charge storage layer 344 (e.g., nanocrystals or a floating gate layer), and an interlevel dielectric layer 346.

The first gate dielectric layer 342 is formed over the substrate 12, including the NVM array 15, as illustrated in FIG. 3. In one embodiment, the first gate dielectric layer 342 is a tunnel oxide that allows Fowler-Nordheim tunneling to be used for programming the NVM array 15, erasing the NVM array 15, or both. The first gate dielectric layer 342 may be thermally grown using an ambient, including steam or oxygen, or may be deposited using a conventional chemical vapor deposition technique, physical vapor deposition technique, atomic layer deposition technique, or a combination thereof. If the first gate dielectric layer 342 is thermally grown, it is not formed over the nitride layer 18. If the first gate dielectric layer 342 is deposited, it is deposited over substantially all of the substrate 12. The first gate dielectric layer 342 can include one or more films of silicon dioxide, silicon nitride, silicon oxynitride, a high-k material (e.g., k greater than 8), or any combination thereof. The high-k material can includes $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $ZrO_2$, other Hf-containing or Zr-containing dielectric material, a doped version of any of the foregoing (lanthanum doped, niobium doped, etc.), or any combination thereof. As used throughout this specification, the sum of the lettered subscripts for any specific compound is 1. The first gate dielectric layer 342 has a thickness in a range of approximately 2 to 20 nm in the substantially completed electronic device.

The charge storage layer 344 can be formed by depositing nanocrystals (also called discontinuous storage elements or quantum dots) or a floating gate electrode layer over the first gate dielectric layer 342. The charge storage layer 344 can include a material capable of storing a charge, such as polysilicon, amorphous silicon, a nitride, or a metal-containing material. The charge storage layer 344 may be undoped, doped during deposition, or doped after deposition. In one embodiment, the charge storage layer 344 includes nanocrystals that are no greater than 10 nm in any dimension. In another embodiment, the nanocrystals can be larger, however, the nanocrystals are not formed so large as to form a continuous structure (i.e., nanocrystals are fused together). In still another embodiment, the charge storage layer 344 is a floating gate electrode layer. The floating gate electrode layer can include one or more semiconductor-containing, nitrogen-containing, or metal-containing films. In one embodiment, the floating gate electrode layer includes polysilicon or amorphous silicon deposited by a chemical vapor deposition process, but may include other materials or may be deposited by other processes in other embodiments. In one embodiment, the floating gate electrode layer is doped when deposited, and in another embodiment, is doped after it is deposited. In one embodiment, the thickness of the floating gate electrode layer is in a range of 50 to 300 nm.

The interlevel dielectric layer 346 can include one or more dielectric films, any of which may be thermally grown or deposited. The interlevel dielectric layer 346 can include silicon dioxide, silicon oxynitride, an oxide-nitride-oxide stack, or a high-K dielectric material, or any combination thereof. The high-k material can include $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $ZrO_2$, other Hf-containing or Zr-containing dielectric material, a doped version of any of the foregoing (lanthanum doped, niobium doped, etc.), or any combination thereof. In one embodiment, the interlevel dielectric layer 346 is formed by a conventional deposition technique (e.g., chemical of physical vapor deposition). In an alternative embodiment where the charge storage layer 344 includes a metal, such as hafnium or titanium, the interlevel dielectric layer 346 can be formed from the oxidation of part of the charge storage layer 344. In one embodiment, the thickness of the interlevel dielectric layer 346 is in a range of approximately 1 to 20 nm.

The control gate electrode layer 362 can include one or more semiconductor-containing or metal-containing films that are deposited over the substrate 12. In one embodiment, control gate electrode layer 362 includes polysilicon or amorphous silicon deposited by a chemical vapor deposition process, but may include other materials or may be deposited by other processes in other embodiments. In one embodiment, the control gate electrode layer 362 is doped when deposited, and in another embodiment, is doped after it is deposited. In one embodiment, the thickness of the control gate electrode layer 362 is in a range of 50 to 300 nm, and in a finished device, the control gate electrode layer 362 has a dopant concentration of at least 1E19 atoms/cm$^3$.

An anti-reflective layer 364 can include one or more nitride-containing films that are deposited over the control gate electrode layer 362. In one embodiment, the first anti-reflective layer 364 includes silicon nitride, silicon-rich silicon nitride, a silicon oxynitride, a metal-containing nitride (e.g., TiN), a metal-containing oxynitride (e.g., $Ti_aO_bN_c$), a metal-silicon nitride (e.g., $Ta_aSi_bN_c$), a metal-silicon oxynitride (e.g., $Ta_aSi_bO_cN_d$), or any combination thereof. The anti-reflective layer 364 can be deposited by a chemical or physical vapor deposition process. In one embodiment, the thickness of the anti-reflective layer 364 is in a range of approximately 5 to 50 nm.

A mask 38 is formed over the anti-reflective layer 364 within the NVM array 15 and the logic region 17, and the HV and I/O regions 11 and 13 are exposed (not covered by the mask 38). The mask can include a conventional resist material. The conventional resist material may be patterned using a conventional lithographic technique.

Figure 4:
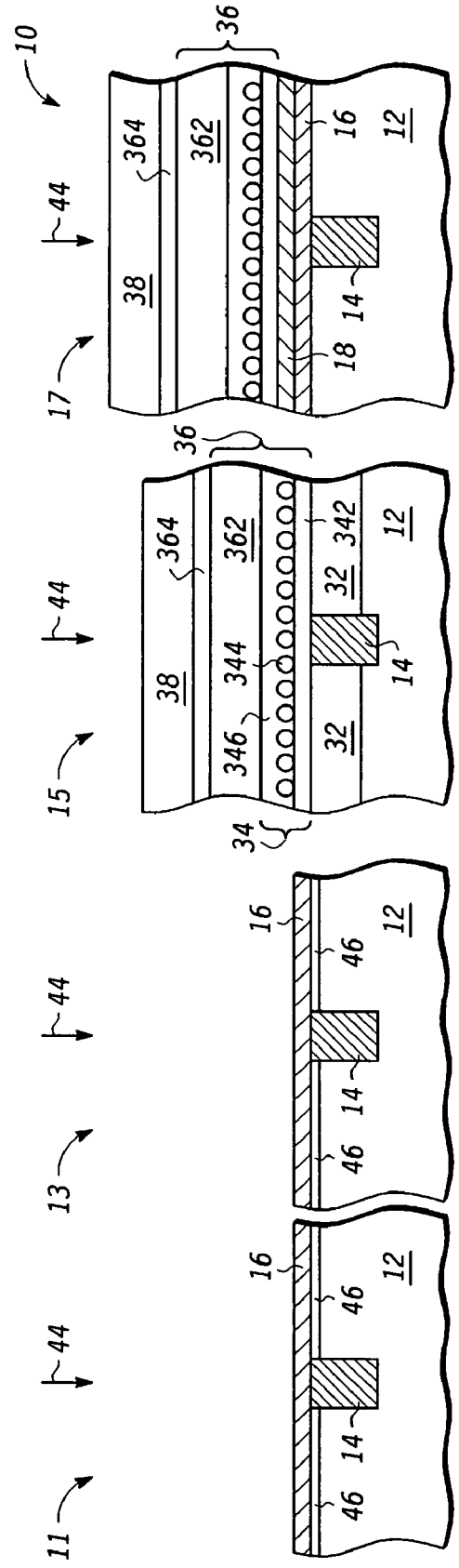
FIG. 4 includes an illustration of a cross-sectional view of the regions of FIG. 3 after etching exposed portions of the NVM stack and forming doped regions within regions of the substrate.

Portions of the NVM stack 36 not covered by the mask 38 are removed by etching those portions of the NVM stack 36, as illustrated in FIG. 4. The etch is typically performed using more than one portion. Each of the portions may be performed isotropically or anisotropically, as a wet etch or dry etch, or any combination of the foregoing. In one embodiment, the etching is performed using at least three portions. The first portion removes exposed portions of the anti-reflective layer 364. The first portion may be timed or may use endpoint detection. The second portion removes exposed portions of the control gate electrode layer 362. The second portion may be timed or use endpoint detection. An optional timed overetch may be used to account for etching non-uniformity across the surface of the substrate 12.

The rest of the etching for the NVM stack 36 can vary depending on the composition of the layers within the charge storage stack 34. In one embodiment, the charge storage layer 344 includes nanocrystals, and the interlevel dielectric layer 346 and the first gate dielectric layer 342 include oxide films. A dilute HF solution (e.g., at least 10 parts $H_2O$ per part HF) can be used to remove portions of the charge storage stack 34 that are not covered by the mask 38. In another embodiment, the charge storage layer 344 includes nanocrystals, the interlevel dielectric layer 346 includes a nitride film, and the first gate dielectric layer 342 includes an oxide film. In this embodiment, a wet or dry etch can be used to remove the nitride film within the interlevel dielectric layer 346, and a dilute HF solution can be used to remove the charge storage layer 344 and first gate dielectric layer 342. In still another embodiment, the first gate dielectric layer 342 includes a nitride. After the interlevel dielectric layer 346 is etched, a $H_3PO_4$ solution can be used to remove the charge storage layer 344 and first gate dielectric layer 342.

In another embodiment, the charge storage layer 344 includes a floating gate electrode layer. A third portion of the etch removes exposed portions of the interlevel dielectric layer 346. The third portion may be timed or use endpoint detection. A fourth portion removes exposed portions of the floating gate electrode layer. The fourth portion may be timed or use endpoint detection. An optional timed overetch may be used to account for etching non-uniformity across the surface of the substrate 12. A fifth portion removes exposed portions of the first gate dielectric layer 342. The fifth portion may be performed as a wet or dry etch.

In one particular embodiment, the first gate dielectric layer 342 is $SiO_2$, the charge storage layer 344 is silicon nanocrystals, the interlevel dielectric layer 346 is $SiO_2$, the control gate electrode layer 362 is polysilicon, and the anti-reflective layer 364 is silicon-rich silicon nitride.

In one exemplary, non-limiting embodiment, portions of the anti-reflective layer 364 are removed using a timed anisotropic plasma etch with one or more fluorine-based gases, such as $SF_6$, $CF_4$, or the like, and one or more optional noble gases (e.g., He, Ne, Ar, or the like) to provide at least some physical sputtering component to the etch. The time for the etch is selected to remove substantially all of the anti-reflective layer 364 at locations not covered by the mask 38. The underlying control gate electrode layer 362 is then removed in a anisotropic plasma etch using one or more halogen-based gases, including fluorine (e.g., $SF_6$, $CF_4$, etc.), chlorine (e.g., $Cl_2$, HCl, etc.), bromine (e.g., HBr, $Br_2$), iodine (e.g., $ICl_5$, etc.), or any combination thereof. The etch chemistry, when etching the control gate electrode layer 362, can also include an optional $O_2$ flow. The control gate electrode layer 362 etch is selective to the underlying interlevel dielectric layer 346 and uses an endpoint detection system to stop the etch. An optional overetch is carried out using the same gas flows to reduce etch non-uniformity across the substrate 12. This overetch is a short timed etch. A dilute HF wet etch with physical agitation is used to remove the charge storage stack 34, including the nanocrystals within the charge storage layer 344. The physical agitation may be provided by a conventional megasonic or ultrasonic cleaning system. Alternatively, another timed plasma etch using any one or more of the halogen-based gases, as described with respect to the control gate electrode layer 362 can be used to remove any one or more of the layers within the charge storage stack 34. After reading this specification, skilled artisans will appreciate that many different etch chemistries and etching methods can be used when patterning the NVM stack 36 to achieve NVM structures.

After reading this specification, skilled artisans will appreciate that many different materials may be used for the layers within the NVM stack 36. The etch chemistries can depend on the various compositions of the layers. Some or all of the portions of the etch sequence can use etch chemistries that are selective to an underlying layer. For example, the etch chemistry used for the portion of the etch that removes exposed portions of the control gate electrode layer 362 can etch the material within the control gate electrode layer 362 at a significantly higher rate as compared to the interlevel dielectric layer 346, and the etch chemistry used for the portion of the etch that removes exposed portions of the first gate dielectric layer 342 can etch the material within the first gate dielectric layer 342 at a significantly higher rate as compared to the material within the well regions 32. Some portions of the etch sequence can use etch chemistries that are not selective to an underlying layer. For example, the anti-reflective layer 364 can include silicon-rich silicon nitride, and the control gate electrode layer 362 can include polysilicon. In this particular embodiment, etch selectivity between the anti-reflective layer 364 and the control gate electrode layer 362 is not critical. Thus, the type of etch performed (wet versus dry), the etch chemistry, and whether a timed etch, endpoint detection or a combination of endpoint with a timed overetch is used can be varied to meet the needs and desires of the electronic device fabricator. After the NVM stack 36 has been patterned, the mask 38 is removed using a conventional technique. After the etching sequence, the anti-reflective layer 364 and NVM stack 36 no longer overlie the HV and I/O regions 11 and 13.

At this point in the process, one or both of the nitride layer 18 and the oxide layer 16 can be removed from over the HV and I/O regions 11 and 13. In one embodiment, the nitride layer 18 is removed, and the oxide layer 16 remains, as illustrated in FIG. 4. A dopant is introduced into the HV and I/O regions 11 and 13 of the substrate 12 to form doped regions 46 that will be subsequently driven into the substrate 12 to form well regions. The dopant may be a p-type dopant (e.g., boron) or an n-type dopant (e.g., phosphorus or arsenic). In one embodiment, the dopant can be introduced using ion implantation (illustrated as arrows 44 in FIG. 4). The mask 38 prevents a significant amount of the second dopant from entering the substrate 12 within portions over the NVM array 15 and substantially all of the logic region 17. After the doped regions 46 are formed, the mask 38 is removed using a conventional technique. If exposed portions of the oxide layer 16 have not yet been removed, they can be removed at this time.

Figure 5:
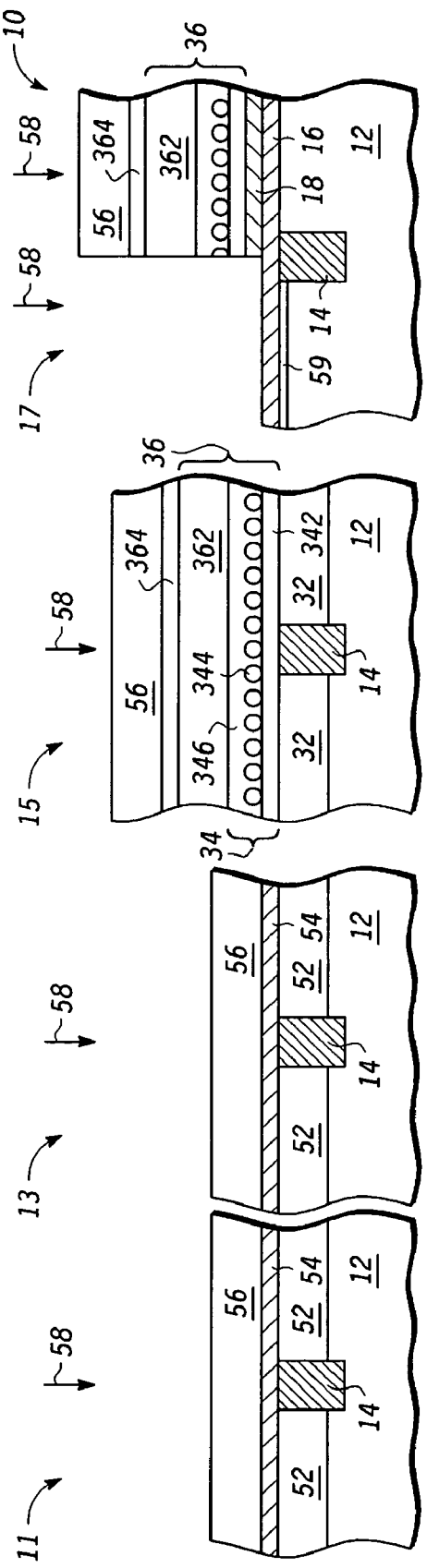
FIG. 5 includes an illustration of a cross-sectional views of the regions of FIG. 4 after forming a first gate dielectric layer, forming a mask, etching portions of the NVM stack over a first part within the logic portion, and doping the first part of the logic region that will become a well region within the logic region.

An optional well drive cycle is performed to drive the dopant from the doped regions 46 further into the substrate 12 to form the well regions 52 within the HV and I/O regions 11 and 13, as illustrated in FIG. 5. A second gate dielectric layer 54 is formed over the substrate 12, including the HV region 11 and the I/O region 13, the NVM array 15, and the logic region 17. The second gate dielectric layer 54 may be thermally grown using an ambient including steam or oxygen, or may be deposited using a conventional chemical vapor deposition technique, physical vapor deposition technique, atomic layer deposition technique, or a combination thereof. The second gate dielectric layer 54 can include one or more films of silicon dioxide, silicon nitride, silicon oxynitride, a high-k material (e.g., k greater than 7), or any combination thereof. The high-k material can include $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $ZrO_2$, other Hf-containing or Zr-containing dielectric material, a doped version of any of the foregoing (lanthanum doped, niobium doped, etc.), or any combination thereof. The second gate dielectric layer 54 has a thickness in a range of approximately 5 to 50 nm in a substantially completed electronic device.

A mask 56 is formed over the HV region 11, I/O region 13, NVM array 15, and portions of the logic region 17. A first part of the logic region 17 is exposed, and a second part of the logic region 17 is covered by the mask 56. The mask 56 can include a conventional resist material. The conventional resist material may be patterned using a conventional lithographic technique. The NVM stack 36 is removed from the first part of the logic region 17. The NVM stack 36 can be removed by etching using any one or more of the techniques previously described. The etching of the NVM stack 36 within the first part of the logic region 17 may be the same or different from the etching of the NVM stack 36 within the HV and I/O regions 11 and 13. One or both of the nitride layer 18 and the oxide layer 16 can be removed from over the first part of the logic region 17. In one embodiment, the nitride layer 18 is removed, and the oxide layer 16 remains.

A dopant is introduced into the substrate 12 of the first part within the logic region 17 to form a doped region 59 that will be subsequently driven into the substrate 12 to form another well region. The dopant may be a p-type dopant (e.g., boron) or an n-type dopant (e.g., phosphorus or arsenic). In one embodiment, the dopant can be introduced using ion implantation (illustrated as arrows 58 in FIG. 5). The mask 56 prevents a significant amount of the dopant from entering the substrate 12 within the HV region 11, I/O region 13, NVM array 15, and second part of the logic region 17. If exposed portions of the oxide layer 16 have not yet been removed, they can be removed at this time. After the doped regions 59 are formed, the mask 56 is removed using a conventional technique.

A mask 62 is formed over the HV region 11, I/O region 13, NVM array 15, and portions of the logic region 17. The second part of the logic region 17 is exposed, and the first part of the logic region 17 is covered by the mask 62. The mask 62 can include a conventional resist material. The conventional resist material may be patterned using a conventional lithographic technique. The NVM stack 36 is removed from the second part of the logic region 17. The NVM stack 36 can be removed by etching using any one or more of the techniques previously described. The etching of the NVM stack 36 within the second part of the logic region 17 may be the same or different from the etching of the NVM stack 36 within the HV and I/O regions 11 and 13. One or both of the nitride layer 18 and the oxide layer 16 can be removed from over the second part of the logic region 17. In one embodiment, the nitride layer 18 is removed, and the oxide layer 16 remains.

Figure 6:
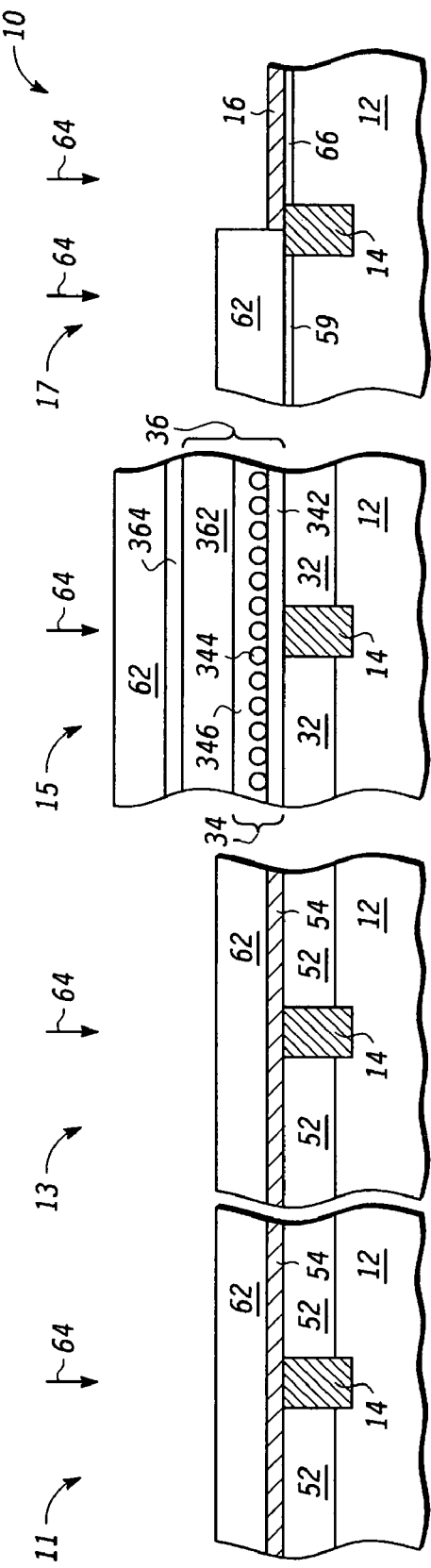
FIG. 6 includes an illustration of a cross-sectional view of the regions of FIG. 5 after forming a second gate dielectric layer, forming a mask, etching portions of the NVM stack over a second part within the logic portion, and doping the second part of the logic region that will become another well region within the logic region.

A dopant is introduced into the substrate 12 of the second part within the logic region 17 to form a doped region 66 that will be subsequently driven into the substrate 12 to form another well region. The dopant may be a p-type dopant (e.g., boron) or an n-type dopant (e.g., phosphorus or arsenic). In one particular embodiment, the doped regions 59 and 66 have opposite conductivity types (e.g., one is n-type and the other is p-type). In one embodiment, the dopant can be introduced using ion implantation (illustrated as arrows 64 in FIG. 6). The mask 62 prevents a significant amount of the dopant from entering the substrate 12 within the HV region 11, I/O region 13, NVM array 15, and first part of the logic region 17. If exposed portions of the oxide layer 16 have not yet been removed, they can be removed at this time. After the doped regions 66 are formed, the mask 62 is removed using a conventional technique.

Figure 7:
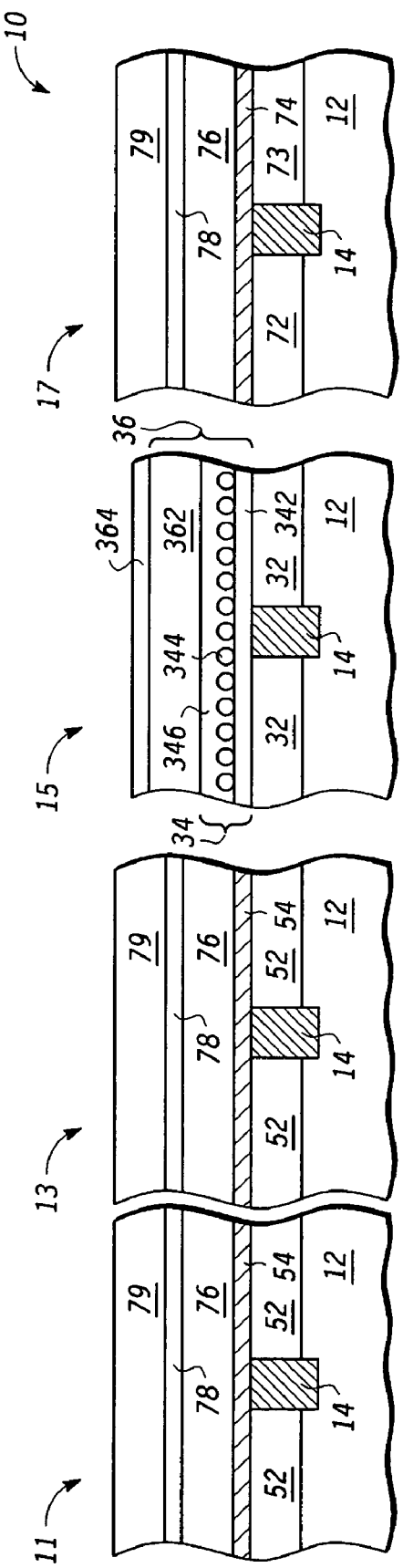
FIG. 7 includes an illustration of a cross-sectional view of the regions of FIG. 6 after forming a first gate electrode layer, forming an anti-reflective layer, forming a mask, and etching exposed portions of the first gate electrode layer and the anti-reflective layer.

An optional well drive cycle is performed to drive the dopants from the doped regions 59 and 66 further into the substrate 12 to form well regions 72 and 73 within the logic region 17, as illustrated in FIG. 7. A third gate dielectric layer 74 is formed over the substrate 12, including the logic region 17. The third gate dielectric layer 74 may be thermally grown using an ambient, including steam or oxygen or deposited using a conventional chemical vapor deposition technique, physical vapor deposition technique, atomic layer deposition technique, or a combination thereof. The third gate dielectric layer 74 can include one or more films of silicon dioxide, silicon nitride, silicon oxynitride, a high-k material (e.g., k greater than 7), or any combination thereof. The high-k material can include $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $ZrO_2$, other Hf-containing or Zr-containing dielectric material, a doped version of any of the foregoing (lanthanum doped, niobium doped, etc.), or any combination thereof. The third gate dielectric layer 74 has a thickness in a range of approximately 1 to 20 nm in the substantially completed electronic device. In one embodiment, the second gate dielectric layer 54 may become thicker during the formation of the third gate dielectric layer 74, as compared to when the second gate dielectric layer 54 was originally formed.

A first gate electrode layer 76 and an anti-reflective layer 78 are formed over the substrate 12, as illustrated in FIG. 7. The first gate electrode layer 76 can include one or more semiconductor-containing or metal-containing films that are deposited over the substrate 12. In one embodiment, first gate electrode layer 76 includes polysilicon or amorphous silicon deposited by a chemical vapor deposition process, but may include other materials or may be deposited by other processes in other embodiments. In one embodiment, the first gate electrode layer 76 is doped when deposited, and in another embodiment, is doped after it is deposited. In one embodiment, the thickness of the first gate electrode layer 76 is in a range of 50 to 300 nm.

The anti-reflective layer 78 can include one or more nitride-containing films that are deposited over the first gate electrode layer 76. In one embodiment, anti-reflective layer 78 includes silicon nitride, silicon-rich silicon nitride, a silicon oxynitride, a metal-containing nitride (e.g., TiN), a metal-containing oxynitride (e.g., $Ti_aO_bN_c$), a metal-silicon nitride (e.g., $Ta_aSi_bN_c$), a metal-silicon oxynitride (e.g., $Ta_aSi_bO_cN_d$), or any combination thereof. The anti-reflective layer 78 can be deposited by a chemical or physical vapor deposition process. In one embodiment, the thickness of the anti-reflective layer 78 is in a range of 5 to 50 nm.

A mask 79 is formed over anti-reflective layer 78 within HV, I/O, and logic regions 11, 13, and 17, as illustrated in FIG. 7. The NVM array 15 is not covered by the mask 79. The mask 79 can include a conventional resist material. The conventional resist material may be patterned using a conventional lithographic technique. Exposed portions (not illustrated) of the anti-reflective layer 78 and first gate electrode layer 76 (not covered by the mask 79) are removed by etching the exposed portions of those layers. The etching may be performed isotropically or anisotropically, as a wet etch, dry etch, or any combination of the foregoing. In one embodiment, the etching is performed as a dry etch using endpoint detection when any one or more of the second gate dielectric layer 54, the third gate dielectric layer 74, or both becomes exposed. An optional timed overetch can be used to account for nonuniform etching across the substrate 12. After patterning the first gate electrode layer 76, the mask 79 is removed using a conventional technique.

Figure 8:
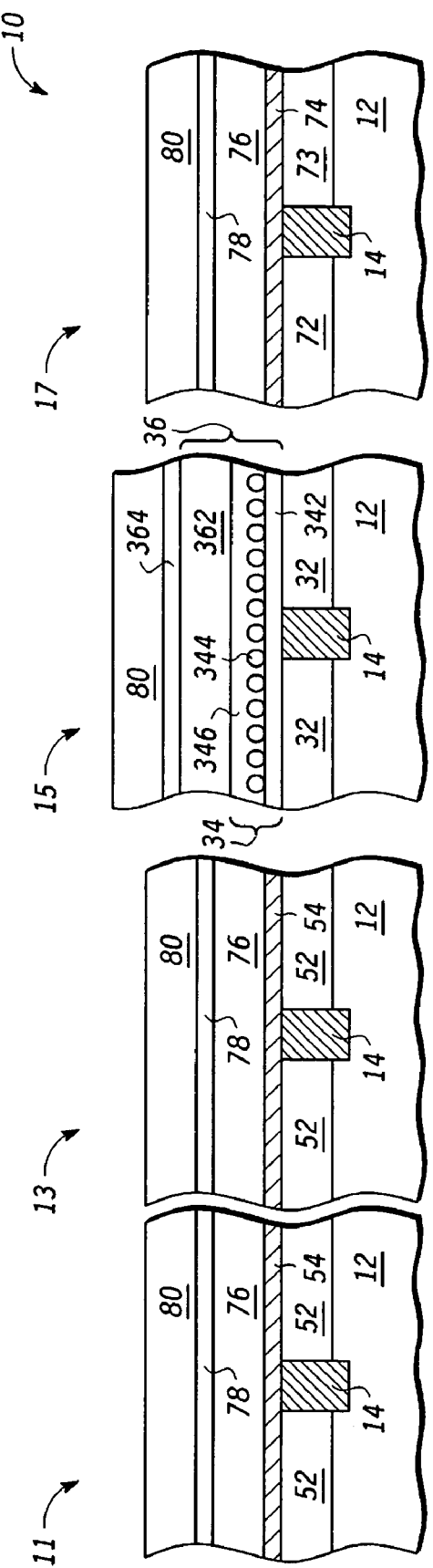
FIG. 8 includes an illustration of a cross-sectional view of the regions of FIG. 7 after forming a mask over locations where NVM structures and gate electrodes are to be formed.

A mask 80 is formed over anti-reflective layer 78 at locations where the anti-reflective layer 78 and first gate electrode layer 76 are to remain within the HV, I/O, and logic regions 11, 13, and 17, and over anti-reflective layer 364 at locations where the anti-reflective layer 364 and NVM stack 36 are to remain within the NVM array 15, as illustrated in FIG. 8. The mask 80 generally corresponds to the shape of gate electrodes and word lines that will be formed within the HV region 11, I/O region 13, NVM array 15, and logic region 17. The mask 80 can include a conventional resist material. The conventional resist material may be patterned using a conventional lithographic technique. Exposed portions (not illustrated) of the anti-reflective layers 364 and 78, NVM stack 36, and the first gate electrode layer 76 (not covered by the mask 80) are removed by etching the exposed portions of those layers. The etching may be performed using any of the embodiments previously described when removing portions of the anti-reflective layer 364 and NVM stack 36 from the HV, I/O, and logic regions 11, 13, and 17. After patterning, the mask 80 is removed using a conventional technique.

The exposed portions of the anti-reflective layers 364 and 78 can be removed at this time using a conventional technique to expose underlying portions of the first gate electrode layer 76. Alternatively, the exposed portions of the anti-reflective layers 364 and 78 can be removed during formation of subsequently formed sidewall spacers as described below.

Figure 9:
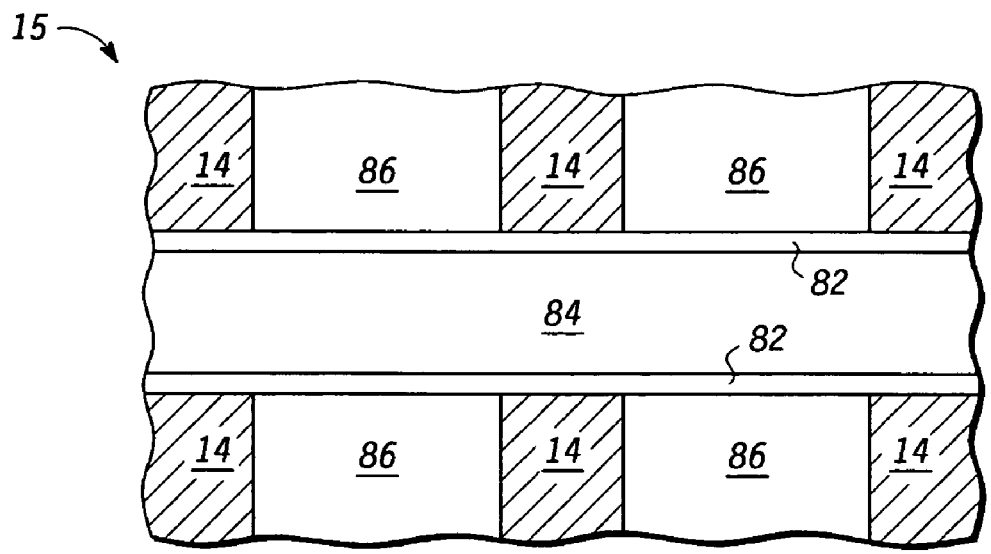
FIG. 9 includes an illustration of a top view of a portion of the NVM array after forming a set of spacers and silicide regions.

Exposed sidewalls of the first gate electrode layer 76 can be oxidized to form a protective oxide layer (not illustrated). A set of spacers 82 is formed along sides of the NVM stack 36 and the first gate electrode layer 76. FIG. 9 includes a top view of a portion of the NVM array 15, and FIG. 10 includes a top view of a portion of the logic region 17. The set of spacers 82 can be formed by depositing an insulating layer (e.g., an oxide, a nitride, or an oxynitride) over the substrate 12 and anisotropically etching portions of the insulating layer. In one embodiment, the set of spacers 82 have a generally parabolic (curved) outer surface, as seen from a cross-sectional view, and the widths of the set of spacers 82 at their base is approximately the same as the thickness of the insulating layer as deposited. The set of spacers 82 are formed along vertical or near vertical surfaces of the substrate 12, including adjacent to the sides of the NVM stack 36 and first gate electrode layer 76.

One or more masks and one or more doping operations are performed to form S/D regions for the NVM cells and transistors being formed. The masks and doping operations can also be used to form extension regions. The process integration of spacer formation, extension region formation, and S/D region are conventional. An anneal is performed to activate the dopant from the implants to form S/D regions for the NVM cells and transistors. Any insulating layers (e.g., gate dielectric layers), to the extent any still overlie the S/D regions, are removed using a conventional etching technique.

A metal-containing layer (not illustrated) is formed over the substrate 12. The metal-containing layer can include a material capable of reacting with silicon to form a silicide, and can include Ti, Ta, Co, W, Mo, Zr, Pt, other suitable material, or any combination thereof. In one embodiment, the metal-containing layer is performed using a conventional deposition technique.

Figure 10:
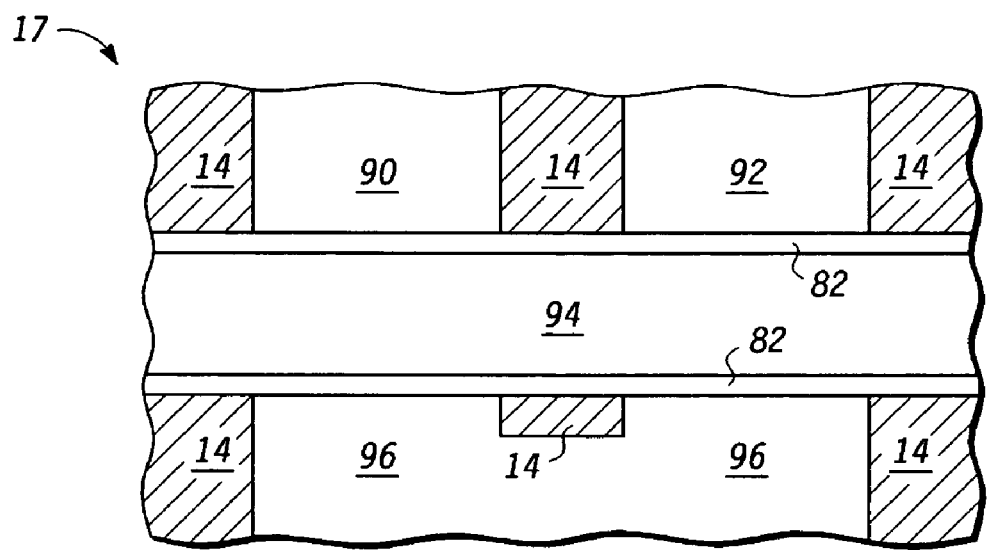
FIG. 10 includes an illustration of a top view of a portion of the logic region at the same point in the process flow as FIG. 9.

Exposed portions of the control gate electrode layer 362, the first gate electrode layer 76 and S/D regions react with the metal-containing layer to formed silicide regions 84, 86, 90, 92, 94, and 96 as illustrated in FIGS. 9 and 10. Portions of the metal-containing layer that overlie insulating materials (e.g., oxide, nitride, oxynitride, etc.) do not significantly react with one another. Unreacted portions of the metal-containing layer are removed using a conventional technique. A combination of the silicide regions 84 and the control electrode layer 362 are word lines for the NVM array 15 (FIG. 9), and a combination of the silicide regions 94 and the first electrode layer 76 are gate electrodes within the HV, I/O, and logic regions 11, 13, and 17 (FIG. 10 includes an illustration of a portion of the logic region 17). The silicide regions 86, 90, 92, and 96 are formed over S/D regions.

Processing can be continued to form a substantially completed electronic device. One or more insulating layers, one or more conductive layers, and one or more encapsulating layers are formed using conventional techniques.

FIG. 9 includes an illustration of two NVM cells within the NVM array 15. FIG. 10 includes an illustration of an inverter within the logic region 17. In one embodiment, the S/D region underlying the silicide region 90, and the S/D region along the left-hand side under silicide region 96 are heavily n-type doped. The S/D region underlying the silicide region 92 and the S/D region along the right-hand side under silicide region 96 are heavily p-type doped. The silicide region 96 straps the S/D regions of different conductivity type to each other. Although not illustrated, the silicide region 90 can be electrically connected to a $V_{SS}$ terminal, the silicide region 92 can be electrically connected to a $V_{DD}$ terminal, an input terminal for the inverter is electrically connected to the silicide region 94, and an output terminal for the inverter is electrically connected to the silicide region 96.

Many other embodiments are possible. For example, the first gate dielectric layer 54 is substantially the same for the HV and I/O regions 11 and 13. Such an embodiment can be used for a one-time-programmable read-only memory. In another embodiment, not illustrated, the HV and I/O regions 11 and 13 may have different gate dielectric layers. Such an embodiment can be used for electrically erasable read-only memory, such as a flash memory. In still other embodiment, either or both of the HV and I/O regions 11 and 13 may include n-channel and p-channel transistors. The processing used to form the logic region 17 (separating the logic region into first and second parts) can be used if the HV region 11, I/O region 13, or both are to have n-channel and p-channel transistors.

In another embodiment, the well drive cycles are optional or may be consolidated. For example, if subsequent processing has sufficient thermal processing to drive dopants to form the well regions 32, 52, 72, and 73, a separate well drive cycle is not needed. In another embodiment, any combination of well regions 32, 52, 72, and 73 may be driven during the same well drive cycle. For example, after forming the doped regions 66, a well drive cycle can be used to form the well regions 32, 52, 72, and 73. Alternatively, one well drive cycle can be used to drive a dopant from doped regions 26 to form well regions 32, and another well drive cycle can be used to drive dopant from doped regions 46, 59, and 66 to form the well regions 52, 72, and 73. After reading this specification, skilled artisans will appreciate that they can use any number of separate well drives that meet their needs or desires.

Embodiments as described herein help to reduce the number of times that edges of the field isolation regions 14 are exposed to etching, and thus help to reduce field isolation region erosion. The protective layer, the NVM stack 36, or both overlie the field isolation region edges at locations where NVM cells and transistors will be formed. After forming the protective layer, the field isolation regions 14 where the NVM structures and gate electrodes will be formed may be exposed to only one etch before the gate dielectric layer for that particular region is formed. For example, in the logic region 17, the masking and etching sequence allows the protective layer and NVM stack 36 to remain unless the protective layer is completely removed from each part of the logic region 17. Thus, too much field isolation region erosion may be substantially eliminated. Stringers (undesired residual portions of the first gate electrode layer 76) are less likely to be formed when the first gate electrode layer 76 is patterned to form gate electrodes. Also, gate dielectric layer thinning and relatively higher electrical fields near the edges of the field isolation regions 14 may be substantially prevented. Process margin can improve, and the process can be used to produce a more reliable electronic device.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

In the foregoing specification, principles of the invention have been described above in connection with specific embodiments. However, one of ordinary skill in the art appreciates that one or more modifications or one or more other changes can be made to any one or more of the embodiments without departing from the scope of the invention as set forth in the claims below. Accordingly, the specification and figures are to be regarded in an illustrative rather than a restrictive sense and any and all such modifications and other changes are intended to be included within the scope of invention.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

What is claimed is:

1. A process for forming a non-volatile memory device, wherein the process comprises:
  forming a trench field isolation region over a substrate to define an active region in the substrate, wherein the active region comprises a first portion, a non-volatile memory portion, and a logic portion;
  forming a sacrificial insulating layer over the first portion of the active region, the non-volatile memory portion of the active region, and the logic portion of the active region;
  removing a first portion of the sacrificial insulating layer from over the non-volatile memory portion of the active region, wherein a first portion of the trench field isolation region from over the non-volatile memory portion is exposed after the first portion of the sacrificial insulating layer is removed;

forming a first gate dielectric layer over the non-volatile memory portion of the active region;

forming a charge storage layer over the substrate;

forming a control gate conductor layer over the charge storage layer;

removing first portions of the charge storage layer and control gate conductor layer that overlie the first portion of the active region;

removing a second portion of the sacrificial insulating layer from over the first portion of the active region, wherein a second portion of the trench field isolation region is exposed after the second portion of the sacrificial insulating layer is removed;

forming a second gate dielectric layer over the first portion of the active region, wherein forming the second gate dielectric layer is performed after forming the first gate dielectric layer;

forming a first resist mask over a first part of the logic portion of the active region to define a first opening;

removing second portions of the control gate conductor layer and charge storage layer underlying the first opening in the first resist mask;

implanting a first dopant for a first well region within the first part of the logic portion, wherein the first well region underlies the first opening;

removing a third portion of the sacrificial insulating layer from over the first part of the logic portion of the active region, wherein a third portion of the trench field isolation region is exposed after the third portion of the sacrificial insulating layer is removed;

removing the first resist mask; and forming a third gate dielectric layer over the logic portion of the active region, wherein forming the third gate dielectric layer is performed after forming the first gate dielectric layer, forming the second gate dielectric layer, and implanting the first dopant.

2. The process of claim 1, wherein forming the trench field isolation region is performed such that the active region further comprises an I/O portion, and wherein the process further comprises:

removing a fourth portion of the sacrificial insulating layer from over the I/O portion of the active region, wherein a fourth portion of the trench field isolation region is exposed after the fourth portion of the sacrificial insulating layer is removed; and forming a fourth gate dielectric layer over the active region, wherein the fourth gate dielectric layer is part of I/O components within the non-volatile memory device, and the second gate dielectric layer is part of HV components within the non-volatile memory device.

3. The process of claim 2, wherein forming the second gate dielectric layer and forming the fourth gate dielectric layer are formed such that the second and fourth gate dielectric layers have substantially a same thickness.

4. The process of claim 2, wherein forming the second gate dielectric layer and forming the fourth gate dielectric layer are performed substantially simultaneously.

5. The process of claim 4, wherein removing the second portion of the sacrificial insulating layer and removing the fourth portion of the sacrificial insulating layer are performed substantially simultaneously.

6. The process of claim 2, wherein:

forming the first gate dielectric layer comprises forming the first gate dielectric layer within non-volatile memory cells;

forming the second gate dielectric layer comprises forming the second gate dielectric layer within HV components;

forming the third gate dielectric layer comprises forming the third gate dielectric layer within logic components.

7. The process of claim 1, wherein:

removing the first portion of the sacrificial insulating layer removes the sacrificial insulating layer only from over the non-volatile memory portion of the active region;

removing the second portion of the sacrificial insulating layer removes the sacrificial insulating layer only from over the first portion of the active region; and removing the third portion of the sacrificial insulating layer removes the sacrificial insulating layer only from over the first part of the logic portion of the active region.

8. The process of claim 1, wherein forming the third gate dielectric layer is performed after forming the first gate dielectric layer and forming the second gate dielectric layer.

9. The process of claim 8, wherein forming the first gate dielectric layer is performed before forming the second gate dielectric layer.

10. The process of claim 1, further comprising forming a first gate conductor layer over the substrate including the first portion of the active region.

11. The process of claim 1, further comprising:

forming a second resist mask over a second part of the logic portion of the active region to define a second opening;

removing third portions of the control gate conductor layer and charge storage layer underlying the second opening in the second resist mask;

implanting a second dopant for a second well region within the logic portion, wherein the second well region underlies the second opening, and the second dopant has a conductivity type opposite the first dopant; and removing the second resist mask, wherein:

implanting the second dopant is performed before forming the third gate dielectric layer; and removing the third portion of the sacrificial insulating layer further comprises removing a second part of the sacrificial insulating layer that overlies the second part of the logic portion.

12. The process of claim 1, wherein at least a portion of the second gate dielectric layer is formed using steam.

13. The process of claim 1, wherein:

the first portion of the trench field isolation region lies immediately adjacent to the first portion of the active region, the second portion of the trench field isolation region lies immediately adjacent to the non-volatile memory portion of the active region, and the third portion of the trench field isolation region lies immediately adjacent to the logic portion of the active region;

the first portion of the field isolation region is exposed to a single oxide etch between forming the sacrificial insulating layer and forming the second gate dielectric layer;

the second portion of the field isolation region is exposed to a single oxide etch between forming the sacrificial insulating layer and forming the first gate dielectric layer; and the third portion of the field isolation region is exposed to a single oxide etch between forming the sacrificial insulating layer and forming the third gate dielectric layer.

14. The process of claim 1, wherein forming the first gate dielectric layer, forming the second gate dielectric layer, and forming the third gate dielectric layer are formed such that the first, second, and third gate dielectric layers have different thicknesses as compared to one another.

15. The process of claim 1, wherein:
forming the first gate dielectric layer comprises forming the first gate dielectric layer within non-volatile memory cells;
forming the second gate dielectric layer comprises forming the second gate dielectric layer within I/O components; and
forming the third gate dielectric layer comprises forming the third gate dielectric layer within logic components 16. The process of claim 1, wherein:
forming the first gate dielectric layer comprises forming the first gate dielectric layer within non-volatile memory cells;
forming the second gate dielectric layer comprises forming the second gate dielectric layer within HV components; and
forming the third gate dielectric layer comprises forming the third gate dielectric layer within logic components.

17. The process of claim 1, wherein forming the third gate dielectric layer and forming the second gate dielectric layer are performed after forming the first gate dielectric layer.

18. The process of claim 1, wherein removing the second portion of the sacrificial insulating layer, forming the second gate dielectric layer, removing the third portion of the sacrificial insulating layer, and forming the third gate dielectric layer are performed after forming the control gate conductor layer.

19. The process of claim 1, further comprising forming a second well region within the first portion of the active region.

20. A process for forming a non-volatile memory device, wherein the process comprises:
forming a trench field isolation region over a substrate to define an active region in the substrate, wherein:
the active region comprises a first portion, a non-volatile memory portion, and a logic portion;
the trench field isolation region comprises a first portion, a second portion, and a third portion;
the first portion of the trench field isolation region lies immediately adjacent to the first portion of the active region;
the second portion of the trench field isolation region lies immediately adjacent to the non-volatile memory portion of the active region; and
the third portion of the trench field isolation region lies immediately adjacent to the logic portion of the active region;
forming a sacrificial insulating layer over the first portion of the active region, the non-volatile memory portion of the active region, and the logic portion of the active region;
removing a first portion of the sacrificial insulating layer from over the non-volatile memory portion of the active region, wherein the first portion of the trench field isolation region from over the non-volatile memory portion is exposed after the first portion of the sacrificial insulating layer is removed;
forming a first gate dielectric layer over the non-volatile memory portion of the active region;
forming a charge storage layer over the substrate;
forming a control gate conductor layer over the charge storage layer;
removing portions of the charge storage layer and control gate conductor layer that overlie the first portion of the active region and the logic portion of the active region;
removing a second portion of the sacrificial insulating layer from over the first portion of the active region, wherein a second portion of the trench field isolation region is exposed after the second portion of the sacrificial insulating layer is removed;
forming a second gate dielectric layer over the first portion of the active region, wherein forming the second gate dielectric layer is performed after forming the first gate dielectric layer;
removing a third portion of the sacrificial insulating layer from over the logic portion of the active region, wherein a third portion of the trench field isolation region is exposed after the third portion of the sacrificial insulating layer is removed; and
forming a third gate dielectric layer over the logic portion of the active region, wherein forming the third gate dielectric layer is performed after forming the first gate dielectric layer and forming the second gate dielectric layer,
wherein:
the first portion of the field isolation region is exposed to a single oxide etch between forming the sacrificial insulating layer and forming the second gate dielectric layer;
the second portion of the field isolation region is exposed to a single oxide etch between forming the sacrificial insulating layer and forming the first gate dielectric layer; and
the third portion of the field isolation region is exposed to a single oxide etch between forming the sacrificial insulating layer and forming the third gate dielectric layer.

* * * * *